(12) United States Patent
Schadow et al.

(10) Patent No.: US 11,491,634 B2
(45) Date of Patent: Nov. 8, 2022

(54) ELECTRONIC MODULE, IN PARTICULAR FOR A HAND-HELD POWER TOOL

(71) Applicant: Robert Bosch GmbH, Stuttgart (DE)

(72) Inventors: Joachim Schadow, Stuttgart (DE); Joern Stock, Leinfelden-Echterdingen (DE); Florian Esenwein, Leinfelden-Echterdingen (DE)

(73) Assignee: Robert Bosch GmbH, Stuttgart (DE)

( * ) Notice: Subject to any disclaimer, the term of this patent is extended or adjusted under 35 U.S.C. 154(b) by 263 days.

(21) Appl. No.: 16/498,418

(22) PCT Filed: Feb. 28, 2018

(86) PCT No.: PCT/EP2018/054878
§ 371 (c)(1),
(2) Date: Jan. 14, 2021

(87) PCT Pub. No.: WO2018/177671
PCT Pub. Date: Oct. 4, 2018

(65) Prior Publication Data
US 2021/0197357 A1    Jul. 1, 2021

(30) Foreign Application Priority Data
Mar. 29, 2017    (DE) .................... 10 2017 205 310.0

(51) Int. Cl.
*H05K 7/02*    (2006.01)
*H05K 7/04*    (2006.01)
(Continued)

(52) U.S. Cl.
CPC ............ *B25F 5/02* (2013.01); *H05K 5/0217* (2013.01); *H05K 5/0247* (2013.01); *H05K 5/03* (2013.01)

(58) Field of Classification Search
CPC combination set(s) only.
See application file for complete search history.

(56) References Cited

U.S. PATENT DOCUMENTS 7,540,334 B2 * 6/2009 Gass ..................... B25F 5/00
                                                    173/171
9,216,505 B2 * 12/2015 Rejman .................. B25F 5/02
(Continued)

FOREIGN PATENT DOCUMENTS

EP    2 072 192 A1    6/2009
JP    S60-99508 A     6/1985
(Continued)

OTHER PUBLICATIONS

International Search Report corresponding to PCT Application No. PCT/EP2018/054878, dated Jun. 21, 2018 (German and English language document) (7 pages).

*Primary Examiner* — Hung S. Bui
(74) *Attorney, Agent, or Firm* — Maginot, Moore & Beck LLP

(57) ABSTRACT

An electronic module, in particular for a hand-held power tool, includes at least one electronic unit, at least one contacting unit, and at least one cover unit. The at least one electronic unit is captively connected to the at least one cover unit. The at least one contacting unit includes at least one contact element that is configured to make contact with an electric energy source and/or to transfer electronic data. The at least one contacting unit also includes at least one fixing element that is configured to mechanically fix the cover unit, in particular to the tool. The at least one contacting element is mounted at least partially on the at least one fixing element.

13 Claims, 4 Drawing Sheets

(51) Int. Cl.
*B25F 5/02* (2006.01)
*H05K 5/02* (2006.01)
*H05K 5/03* (2006.01)

(56)  References Cited

U.S. PATENT DOCUMENTS

| | | | |
|---|---|---|---|
| 9,595,839 B2 * | 3/2017 | Furui | H02J 7/00 |
| 2004/0160212 A1 * | 8/2004 | Mastaler | B25F 5/02 |
| | | | 320/115 |
| 2005/0280393 A1 | 12/2005 | Feldmann | |
| 2008/0135272 A1 | 6/2008 | Wallgren | |
| 2010/0096151 A1 | 4/2010 | Östling | |
| 2016/0311094 A1 | 10/2016 | Mergener et al. | |

FOREIGN PATENT DOCUMENTS

| | | |
|---|---|---|
| JP | 2016-209997 A | 12/2016 |
| WO | 2013/014914 A2 | 1/2013 |

* cited by examiner

ELECTRONIC MODULE, IN PARTICULAR FOR A HAND-HELD POWER TOOL

This application is a 35 U.S.C. § 371 National Stage Application of PCT/EP2018/054878, filed on Feb. 28, 2018, which claims the benefit of priority to Serial No. DE 10 2017 205 310.0, filed on Mar. 29, 2017 in Germany, the disclosures of which are incorporated herein by reference in their entirety.

BACKGROUND

An electronic module, in particular for a hand-held machine tool, with at least one electronic unit, with at least one contacting unit which comprises at least one contact element which has been provided for contacting a source of electrical energy and/or for transmitting electronic data, and with at least one cover unit, said electronic unit being connected to the at least one cover unit in captive manner, has already been proposed.

SUMMARY

The disclosure takes as its starting point an electronic module, in particular for a hand-held machine tool, with at least one electronic unit, with at least one contacting unit which comprises at least one contact element which has been provided for contacting a source of electrical energy and/or for transmitting electronic data, and with at least one cover unit, said electronic unit being connected to the at least one cover unit in captive manner.

It is proposed that the at least one contacting unit includes at least one fixing element which has been provided for mechanical fixing of the cover unit, in particular to a tool, said at least one contact element being at least partially arranged on said at least one fixing element. As a result, the electronic module can be designed to be particularly compact and stable.

The electronic module, in particular the electronic unit, preferentially exhibits at least one transistor, particularly preferably at least one microprocessor. Particularly preferably, the electronic module, in particular the electronic unit, exhibits at least one arithmetic-logic unit. An "arithmetic-logic unit" is to be understood, in particular, to mean a unit with an information input, with an information-processing unit and with an information output. Advantageously, the arithmetic-logic unit exhibits at least one processor, a memory, input and output means, further electrical components, an operating program, regulating routines, control routines and/or computational routines. Preferentially, the components of the arithmetic-logic unit are arranged on a common board, in particular of the electronic unit, and/or are advantageously arranged in a common housing. The electronic module preferentially exhibits at least one sensor unit for acquisition of an operator-specific and/or tool-specific parameter. A "sensor unit" in this connection is to be understood, in particular, to mean a unit that has been provided to record at least one parameter and/or a physical property, the recording being active, such as, in particular, by generating and emitting an electrical measurement signal, and/or passive, such as may take place, in particular, by an acquisition of changes in the properties of a sensor component.

The electronic module, in particular the electronic unit, preferentially exhibits at least one output unit for outputting at least one item of optical, acoustic and/or haptic information. The output unit preferably exhibits at least one light-emitting diode, an optical waveguide, an indicator panel, a display, a buzzer, a loudspeaker, a vibrating element and/or another output element appearing sensible to a person skilled in the art.

The electronic module, in particular the electronic unit, preferentially exhibits at least one input unit which, in particular, includes a switch, a button, a touch-sensitive and/or proximity-sensitive surface, a microphone or another operating element appearing sensible to a person skilled in the art.

The electronic module, in particular the electronic unit, preferentially exhibits at least one communication unit, in particular an NFC communication unit, for a hard-wired and/or wireless transmission of data, in particular with a tool and/or with a hand-held machine tool. The communication unit has preferentially been designed as a transceiver unit for transmitting electronic data. The electronic module preferably exhibits at least two transceiver units or information units, in particular at least one NFC transceiver unit and a Bluetooth transceiver unit. Alternatively or additionally, the electronic module includes at least one or more information unit(s), such as, for instance, a QR code, a data-matrix code or the like. Preferentially, at least one of the at least two transceiver units, in particular an NFC transceiver unit, has been provided for a quick establishment of a connection between the electronic module and an external unit, in particular the hand-held machine tool. At least one of the at least two transceiver units, in particular a Bluetooth transceiver unit, has preferably been provided for a transmission of data, in particular for a transmission of a multitude of data within a short time-interval, between the electronic module and an external unit, in particular the hand-held machine tool. An antenna of the communication unit has preferentially been arranged on the electronic module in such a manner that a principal direction of radiation of the antenna can occur in the direction of the cover unit.

In this connection, the tool may, in particular, take the form of a machine, in particular a hand-held machine tool, working clothes and/or a technical aid such as, in particular, an armband and/or a wristwatch. A "hand-held machine tool" is to be understood, in particular, to mean a workpiece-processing machine, but advantageously a drilling machine, a jackhammer and/or percussion hammer, a saw, a plane, a screwdriver, a milling machine, a separating grinder, an angle grinder, a cutting tool, a tile-cutter, a garden implement and/or a multi-function tool.

The electronic module is preferentially capable of being mechanically and/or electrically connected to the hand-held machine tool; in particular, the electronic module is capable of being arranged on the hand-held machine tool by means of a preferably detachable holding mechanism. Furthermore, it is conceivable that the communication unit has been provided for an exchange of data with an external instrument such as, for instance, a smartphone, a tablet, a PC and/or similar, in particular for controlling the electronic module, for a firmware upgrade, for a readout of the electronic module or for another function appearing sensible to a person skilled in the art.

A system including the electronic module preferentially exhibits at least one shielding element, in particular a plastic plate or a spacer element, which has been provided for the purpose of realizing a decoupling and/or a shielding of the electronic module from thermal and/or mechanical influences. Furthermore, it is conceivable that the electronic module exhibits, for an increase and/or for an attenuation of a radiated transmitting power of the communication unit, at least one reflecting element, in particular a plastic plate, which has been provided to reflect, to focus an electromagnetic radiation incident on the reflecting element, and/or to enable a preferred propagation of an emitted radiation. The reflecting element and/or the shielding element preferentially exhibit(s) a maximum thickness that, in particular, is less than 15 mm, preferably less than 10 mm, and particularly preferably less than 5 mm. Advantageously, the reflecting element and/or the shielding element exhibit(s) a maximum thickness that, in particular, corresponds to a value from a range of values from 1 mm to 10 mm, preferably to a value from a range of values from 1 mm to 6 mm, and particularly preferably to a value from a range of values from 2 mm to 3 mm. Preferentially, the reflecting element and/or the shielding element is/are arranged between an outer surface of the housing, in particular an outer surface of a bottom, of the electronic module and at least one antenna element of the communication unit of the electronic module.

Moreover, it is conceivable that application-specific information and/or information specific to the hand-held machine tool has been saved in the electronic module, in particular in the electronic unit. On the basis of the application-specific information and/or information specific to the hand-held machine tool, the electronic module can output instructions and/or hints to a user, depending on a use of the hand-held machine tool. For instance, it is conceivable that a user communicates an activity to be carried out to the electronic module by means of an input unit or by means of transmission of data to a communication unit, and thereupon the electronic module suggests a suitable tool for the activity to be carried out, in particular a hand-held machine tool. Furthermore, it is conceivable that the electronic module can, independently of a communication with the hand-held machine tool and/or with an external unit, acquire, process and/or store data which, for instance after an acquisition, processing and/or storage intrinsic to the electronic module, can be read out, in particular by means of a hard-wired and/or wireless data connection to a gateway, to a readout apparatus or the like.

A "contacting unit" is to be understood, in particular, to mean a unit that provides at least one contacting element for an electrical contacting of the electronic module and/or for a transmission of data and/or for a transmission of electrical energy for operating at least the electronic unit. The contacting unit is of wireless and/or, preferably, hard-wired design. Furthermore, it is conceivable that the contacting unit has been designed, at least partially, as one unit with a communication unit of the electronic module. Preferentially, at least one contacting element has been designed as a contact tab, a contact spring, a contact clip or another contacting element appearing sensible to a person skilled in the art.

A "cover unit" is to be understood, in particular, to mean a unit that protects at least one side of the electronic unit and/or of the contacting unit in a covering manner from a contact, and/or that seals at least one opening, in particular at least one housing opening of a housing of the electronic module or of a housing of the hand-held machine tool. The cover unit preferentially has a slight static effect with respect to a housing at least partially accommodating the cover unit, since, in particular, the housing at least partially accommodating the cover unit performs, as far as possible, a static function and/or has been provided for a support of forces acting on the cover unit.

On a side facing away from the electronic unit, the cover unit preferentially exhibits a closed surface which extends, in particular, over the electronic unit and/or the contacting unit. The input unit and/or the output unit is/are preferentially arranged at least partially on the cover unit, in particular on a side of the cover unit facing away from the electronic unit. By means of an orientation and/or arrangement of the electronic unit on the cover unit, a short communication link for a cabling of the input unit and/or of the output unit can advantageously be obtained. For instance, an LED or display arranged directly on an electronic unit designed as a printed circuit board can advantageously also be easily guided outward, in particular onto a side of the cover unit facing away from the electronic unit. The source of electrical energy is preferably constituted by a button cell, in particular by a button cell of size 2450 or 2032 or by a pouch pack with, for example, lithium-polymer batteries.

The fixing element preferentially takes the form of a positive-closure element and/or a force-closure element. In this connection, it is conceivable that the fixing element takes the form of a plug-in element, a screw thread or a latching means. The fixing element has been provided, in particular, for fixing the cover unit with a tool, with a housing unit and/or with an expansion unit. "Provided" is to be understood to mean, in particular, specially programmed, designed and/or equipped. The statement that an object has been provided for a defined function is to be understood, in particular, to mean that the object performs and/or carries out this defined function in at least one application state and/or operating state.

In another configuration of the disclosure, it is proposed that the at least one contact element has been provided for an axial contacting with the source of electrical energy and/or with a further electronic unit. As a result, a particularly high contact reliability can be achieved. The further electronic unit is preferentially constituted by a separate expansion unit, by an expansion unit, by an electronic unit of the tool and/or by a source of electrical energy. An "axial contacting" in this connection is to be understood, in particular, to mean a contacting in an axial direction and/or via contact surfaces that extend at least substantially perpendicular to the axial direction. The axial direction extends, in particular, parallel to a cylinder axis of an imaginary cylinder with the smallest possible radius that just encloses the cover unit. "At least substantially" in this connection is to be understood to mean, in particular, with a deviation of at most 20°, preferably of at most 5°, particularly preferably of at most 1°.

Moreover, it is proposed that the at least one contact element has been provided for a radial contacting with the source of electrical energy and/or with a further electronic unit. As a result, a particularly high contact reliability can be achieved. A "radial contacting" in this connection is to be understood, in particular, to mean a contacting in a radial direction and/or via contact surfaces that extend at least substantially perpendicular to the radial direction. The radial direction extends, in particular, at least substantially perpendicular to the axial direction.

Furthermore, it is proposed that the electronic module includes at least one expansion unit that has been designed to be capable of coupling with the at least one electronic unit and that has been provided for a functional expansion of the at least one electronic unit. Alternatively and/or additionally, it is proposed that the at least one expansion unit has been designed to be interchangeable with the at least one electronic unit and which has been provided for a functional expansion and/or functional alteration of the at least one electronic unit. As a result, the electronic module can advantageously be expanded retrospectively by functions such as, in particular, newly developed data-transmission standards. A useful life of the electronic module can consequently be extended advantageously. The at least one expansion unit preferably includes at least one data-acquisition unit, a data memory, a data-evaluation unit and/or a data-output unit.

In addition, it is proposed that the at least one expansion unit exhibits at least one bottom element which has been provided at least for sealing a receiving space in which the at least one electronic unit is arranged. As a result, the electronic unit can be protected particularly advantageously from external influences. Furthermore, the electronic module can advantageously be designed to be compact.

In addition, it is proposed that the at least one expansion unit includes at least one communication unit which has been provided for a wireless transmission of data. As a result, data can advantageously be exchanged with an electronic unit of the tool and/or, particularly advantageously, with an external instrument such as, for instance, a smartphone, a tablet and/or a PC. The communication unit has advantageously been provided for a wireless communication, in particular according to a standard of the IEEE 802.11 family, according to a standard according to IEEE 802.15.1, according to a standard according to IEEE 802.15.4, according to a ZigBee standard, according to an RFID standard and/or an NFC standard. In this connection, it is also conceivable that the communication unit has been provided for a hard-wired communication, in particular according to a standard according to IEEE 802.3. Preferentially, at least one source of electrical energy, preferably a button cell, is arranged between, in particular axially between, the at least one electronic unit and the at least one expansion unit.

Furthermore, it is proposed that the at least one contacting unit includes at least one plug-in connection element on which the at least one contact element is arranged. As a result, a particularly reliable contacting can be achieved, in particular between the at least one electronic unit and the at least one expansion unit. The plug-in connection element preferably takes the form of a male connector element and/or a female connector element. Particularly advantageously, the at least one plug-in connection element has been integrally formed with the cover unit.

Moreover, it is proposed that the at least one contact element is arranged at least partially within a cover wall of the at least one cover unit. As a result, the at least one contact element can be protected particularly well against damage. Preferentially, the at least one contact element has been at least partially injected into the cover wall of the at least one cover unit.

Furthermore, it is proposed that the at least one fixing element takes the form of a bayonet closure. As a result, a particularly simple and reliable fixing of the cover unit to a tool and/or to a housing unit can be achieved.

Furthermore, a tool, in particular a hand-held machine tool, with an electronic module according to the disclosure is proposed. As a result, functions of the tool can be expanded particularly advantageously in a straightforward manner.

The electronic module according to the disclosure is not intended to be restricted to the application and practical form described above. In particular, for a performance of a mode of operation described herein the electronic module according to the disclosure may exhibit a number of individual elements, components and units deviating from a number mentioned herein.

BRIEF DESCRIPTION OF THE DRAWINGS

Further advantages result from the following description of the drawings. In the drawings, three embodiments of the disclosure are represented. The drawings, the description and the claims contain numerous features in combination. A person skilled in the art will also expediently consider the features individually, and combine them to form meaningful further combinations.

Shown are.

DETAILED DESCRIPTION

Figure 1:
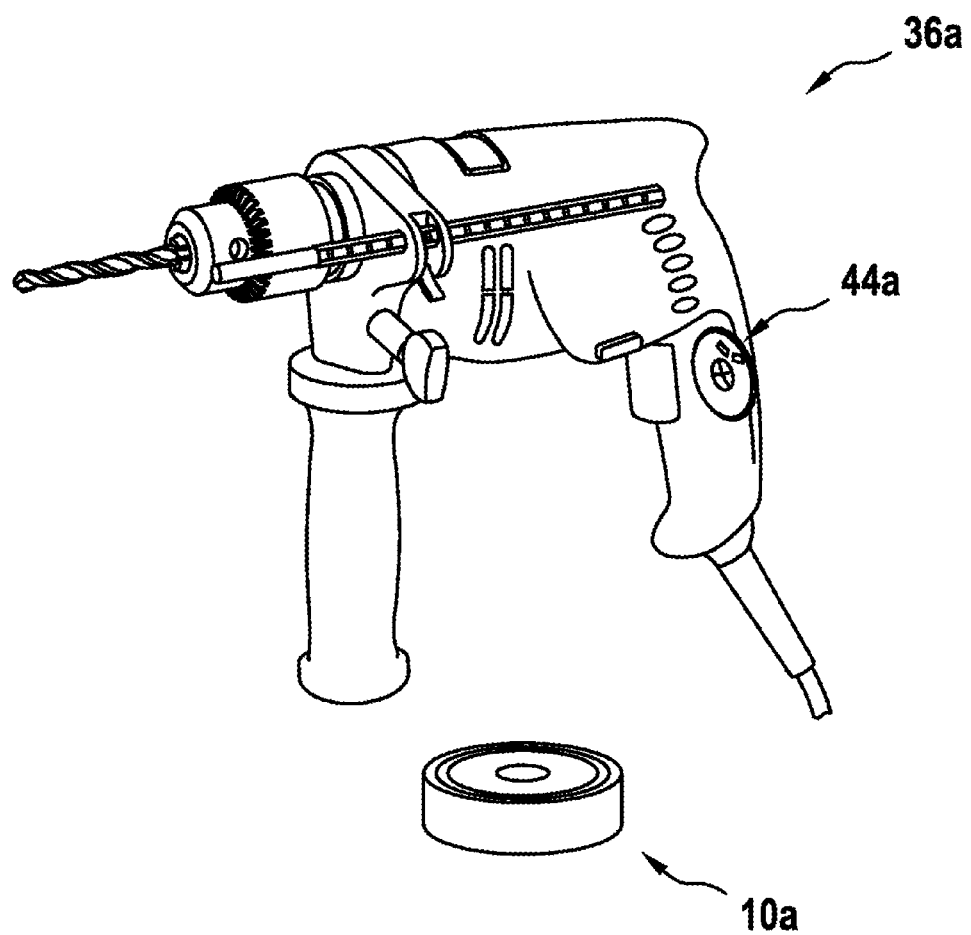
FIG. 1 a tool with an electronic module in a perspectival representation.
Figure 2:
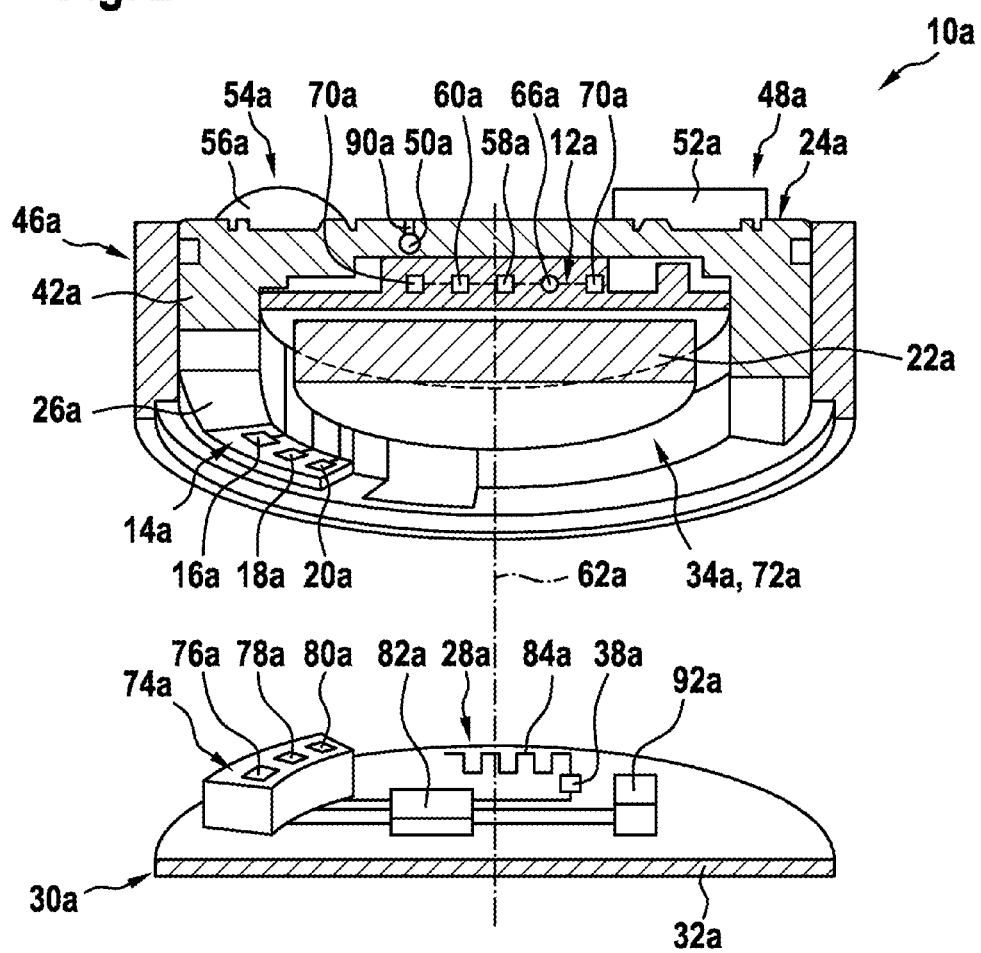
FIG. 2 a first embodiment of the electronic module in a perspectival sectional representation, FIG. 3 a cover unit and an electronic unit of the electronic module in a schematic perspective representation, FIG. 4 a cover unit and an electronic unit of another embodiment of an electronic module in a schematic perspectival representation, FIG. 5 a cover unit and an electronic unit of another embodiment of an electronic module in a schematic perspectival representation and FIG. 6 the electronic modules of the embodiments, and corresponding tools, in a schematic representation.

FIG. 1 shows a first embodiment of an electronic module 10*a* and a tool 36*a*. The tool 36*a* takes the form of a hand-held machine tool. The tool 36*a* exhibits a base unit 44*a* designed as a receiving region for the electronic module 10*a*. The tool 36*a* exhibits a contact means, arranged on the receiving region and not represented in any detail, for an electrical contacting of a contacting unit 14*a* of the electronic module 10*a* (FIG. 2). Data and/or electrical energy for operating the electronic module 10*a* can be transmitted between the tool 36*a* and the electronic module 10*a* by means of the contact means and the contacting unit 14*a*. The electronic module 10*a* is detachably fastened in the base unit 44*a* designed as a receiving region for the electronic module 10*a*.

The contacting unit 14*a* includes a fixing element 26*a*. The fixing element 26*a* has been provided for a mechanical fixing of a cover unit 24*a* of the electronic module 10*a* to the tool 36*a*. Alternatively and/or additionally, the fixing element 26*a* has been provided for a mechanical fixing of the cover unit 24*a* to a housing unit 46*a* of the electronic module 10*a*. The housing unit 46*a* completely encloses the cover unit 24*a*, observed in a radial direction.

The contacting unit 14*a* includes a further fixing element 86*a*. The further fixing element 86*a* exhibits the same structural configuration as the fixing element 26*a*. The fixing element 26*a* and the further fixing element 86*a* are arranged offset in relation to one another by 180°, observed in a peripheral direction. In other words, the fixing element 26*a* and the further fixing element 86*a* are arranged to be rotationally symmetrical to one another.

In one arrangement of the electronic module 10*a* on the tool 36*a*, a contact for a transmission of electrical energy and/or for a transmission of electronic data between the tool 36*a* and the electronic module 10*a* can advantageously be made possible. The electronic module 10*a* includes an electronic unit 12*a*. The electronic module 10*a*, in particular the electronic unit 12*a* of the electronic module 10*a*, includes an output unit 48*a*. The output unit 48*a* comprises output elements 50*a*, 52*a* designed as light-emitting diodes. However, it is also conceivable that the output unit 48*a* exhibits, alternatively or additionally, at least one output element that has been designed as a display, a loudspeaker, a mini display or the like. An item of optical information pertaining to the output element 50*a* is conducted onto a surface of the electronic module 10a via an optical waveguide 90a of the output unit 48a.

The electronic module 10a, in particular the electronic unit 12a, includes an input unit 54a. The input unit 54a includes an operating element 56a designed as an operating button or operating switch. However, it is also conceivable that the input unit 54a exhibits, alternatively or additionally, at least one operating element that has been designed as a touch-sensitive or proximity-sensitive operating element, LED push-button, LED foils or the like. A component-mounting side of the electronic module 10a is oriented in the direction of the cover unit 24a. The output unit 48a and/or the input unit 54a penetrate(s) the cover unit 24a in some regions.

In an upgrade, the output unit 48a includes, for example, LEDs, a buzzer, a siren or the like. Hence a state/status, for example a warning etc., can be communicated to a user. Also, in the course of a search for the electronic module 10a the latter can be contacted by radio and then announces its presence optically, acoustically or by vibrating. In order, for example, to be able to trigger a pairing between a smartphone and an electronic module 10a (for example, for an exchange of data), the input unit 54a, for example, may have been provided, which has been at least partially integrated into the cover unit 24a. As already stated, the input unit 54a may include, in particular, a mechanical button and/or a microswitch or the like. Alternatively, the input unit 54a may also include a suitable sensor for activating the pairing, which, for example, reacts by to a certain motion sequence or knocking rhythm, in order to initiate the pairing process.

If the output unit 48a includes a display, a menu can be indicated therein, and a user can move through the menu via the input unit 54a. The output unit 48a may also include indicating elements that may have been realized as back-lit symbols. In this way, the status of a radio link, of an energy-storage unit, of a measured variable of a sensor, for example, can be indicated, for example by exposures to vibration, etc. If the output unit 48a includes a ring of light, in addition yet further indications can be made possible, such as, for example, an indication of a clock and/or of a dynamic status, similar to a speedometer indication. With this type of indications, the user recognizes very readily the range of measurement in which he/she is currently located, for example, if the circle is illuminated as a semicircular graphic, that 50% has been reached, etc., or, if the circle is almost fully illuminated, that a limiting value, a target value, will soon be reached.

Figure 3:
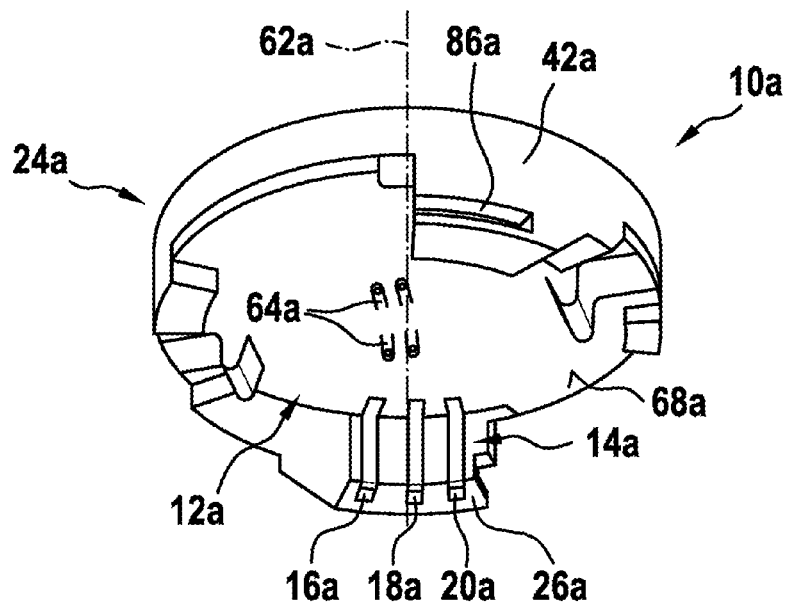

As shown in FIGS. 2 and 3, the contacting unit 14a comprises three contact elements 16a, 18a, 20a. The contact elements 16a, 18a, 20a are partially arranged on the fixing element 26a. The electronic module 10a, in particular the electronic unit 12a, exhibits a sensor unit 58a for acquisition of a user-specific parameter and/or of a parameter specific to the hand-held machine tool. The parameter may encompass, in particular, engine temperatures, total operating hours, tools used, attitude and/or location of the hand-held machine tool, acceleration and/or vibration of the hand-held machine tool, as well as further values appearing sensible to a person skilled in the art.

The electronic module 10a includes an arithmetic-logic unit 60a. The arithmetic-logic unit 60a has been provided for processing of data pertaining to the sensor unit 58a, for processing of user inputs pertaining to the input unit 54a, for an exchange of data with the output unit 48a and/or with a communication unit 70a, for control of an external unit, in particular a tool 36a, and/or for energy management of a source of electrical energy. The contact elements 16a, 18a, 20a take the form of contact surfaces that extend perpendicular to an axial direction 62a. The contact elements 16a, 18a, 20a are partially arranged within a cover wall 42a of the cover unit 24a. The contact elements 16a, 18a, 20a have been partially injected and/or cast into the cover wall 42a. The cover wall 42a has been integrally formed with the fixing element 26a. The cover wall 42a has been integrally formed with the further fixing element 86a.

The contacting unit 14a has been provided for contacting a source of electrical energy 22a via contact elements 64a. The source of electrical energy 22a is constituted by a button cell. The contacting unit 14a includes an additional contact element 66a which has been provided for a wireless contacting of a further source of electrical energy, not represented, and/or for a wireless transmission of data.

In FIG. 3, the cover unit 24a and the electronic unit 12a are represented without a housing unit 46a. On a side facing away from the electronic unit 12a, the cover unit 24a exhibits an at least substantially closed surface which extends over the entire electronic unit 12a. The electronic unit 12a is connected to the cover unit 24a in captive manner. The connection between the electronic unit 12a and the cover unit 24a can be effected via a plug-in connection, a detent, a bayonet, by frictional closure and/or by force closure.

The fixing element 26a is arranged on the cover unit 24a. The fixing element 26a has been provided for detachable fastening of the electronic module 10a to the base unit 44a. The contacting unit 14a is arranged on a side 68a of the electronic unit 12a facing away from the cover unit 24a. The cover unit 24a has been provided for retention of the electronic unit 12a. The cover unit 24a exhibits a retaining element, not shown in any detail, for retention of the electronic unit 12a. The retaining element fixes the electronic unit 12a to the cover unit 24a by positive closure. The fixing element 26a takes the form of a bayonet closure.

The electronic module 10a, in particular the electronic unit 12a, exhibits a communication unit 70a for a wireless exchange of data with an external unit, in particular with a hand-held machine tool. The communication unit 70a has been designed as an NFC communication unit. The communication unit 70a exhibits a contacting element for supplying the electronic module 10a with electrical energy which can be provided, in particular, by the external unit. The contacting element has been provided for a wireless connection to the external unit. The communication unit 70a has been partially formed as one unit with the contacting unit 14a.

The electronic module 10a exhibits an energy-store receiving region 72a. The energy-store receiving region 72a is arranged on a side 68a of the electronic unit 12a facing away from the cover unit 24a. The energy-store receiving region 72a is arranged bearing against the contacting unit 14a.

The electronic module 10a exhibits a layered structure. In one direction, in particular the axial direction 62a, viewed from the cover unit 24a to the contacting unit 14a, the electronic unit 12a is arranged behind the cover unit 24a. Viewed in the direction from the cover unit 24a to the contacting unit 14a, the contacting unit 14a is arranged behind the electronic unit 12a. Viewed in the direction from the cover unit 24a to the contacting unit 14a, the energy-store receiving region 72a is arranged behind the contacting unit 14a.

The electronic module 10a optionally includes an expansion unit 30a. The expansion unit 30a includes a further electronic unit 28a. In this connection, it is also conceivable that the expansion unit 30*a* includes an energy store. The expansion unit 30*a* has been designed to be capable of coupling with the electronic unit 12*a*. The expansion unit 30*a* has been provided for a functional expansion of the electronic unit 12*a*. The contact elements 16*a*, 18*a*, 20*a* have been provided for an axial contacting with the further electronic unit 28*a*. In this case, the contact elements 16*a*, 18*a*, 20*a* do not contact the base unit 44*a* of the tool 36*a*. This contacting can be effected via means, not shown in any detail, pertaining to the expansion unit 30*a*, and/or in a wireless manner. The expansion unit 30*a* exhibits a bottom element 32*a* which has been provided for sealing a receiving space 34*a* in which the electronic unit 12*a* is arranged. In this embodiment, the receiving space 34*a* corresponds to the energy-store receiving region 72*a*. The contact elements 16*a*, 18*a*, 20*a* close off the cover unit 18*a* in the axial direction 62*a*.

The expansion unit 30*a* includes a contacting unit 74*a*. The contacting unit 74*a* exhibits three contact elements 76*a*, 78*a*, 80*a* which have been provided for a contacting with the contact elements 16*a*, 18*a*, 20*a* of the contacting unit 14*a* of the electronic module 10*a*. The contact elements 76*a*, 78*a*, 80*a* are arranged to be congruent with the contact elements 16*a*, 18*a*, 20*a*. The expansion unit 30*a* includes a sensor 92*a* which has been provided for acquisition of a parameter.

The contacting unit 74*a* is arranged on the bottom element 32*a*. The expansion unit 30*a* includes an arithmetic-logic unit 82*a*. The expansion unit 30*a* includes a communication unit 38*a*. The communication unit 38*a* includes an antenna 84*a*. The antenna 84*a* is arranged on the bottom element 32*a*. The communication unit 38*a* has been provided for a wireless transmission of data. The communication unit 38*a* has been provided for a data transmission according to a different standard than the communication unit 70*a*. The electronic unit 12 and the cover unit 24*a* may have been realized for various applications. In this way, a basic version may consist, for example, merely in a beacon function being triggered via a signal, and/or in a message being triggered at regular and or irregular intervals with a radio standard via the communication unit 38*a*. In this case, the output unit 48*a* can be dispensed with.

Figure 4:
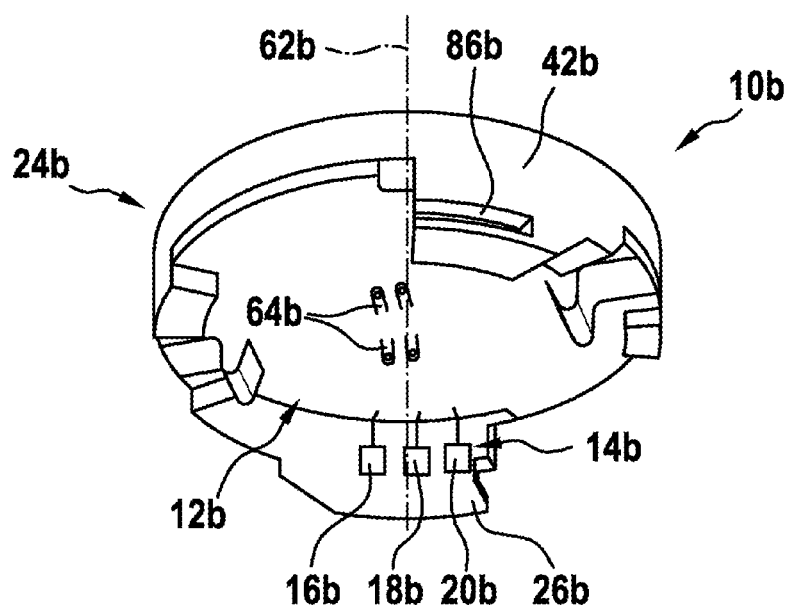
Figure 5:
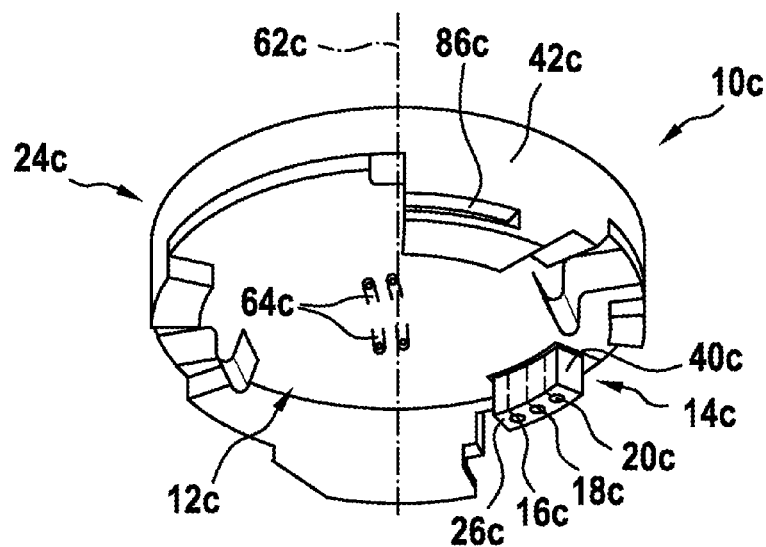

In FIGS. 4 and 5 two further embodiments of the disclosure are shown. The following descriptions and the drawings are substantially restricted to the differences between the embodiments, in which connection, with respect to identically designated components, in particular with respect to components having identical reference symbols, reference may also be made, in principle, to the drawings and/or the description of the other embodiments, shown in particular in FIGS. 1 to 3. For the purpose of distinguishing the embodiments, the letter "a" has been suffixed to the reference symbols of the embodiment in FIGS. 1 to 3. In the embodiments shown in FIGS. 4 and 5, the letter "a" has been replaced by the letters "b" and "c".

Figure 6:
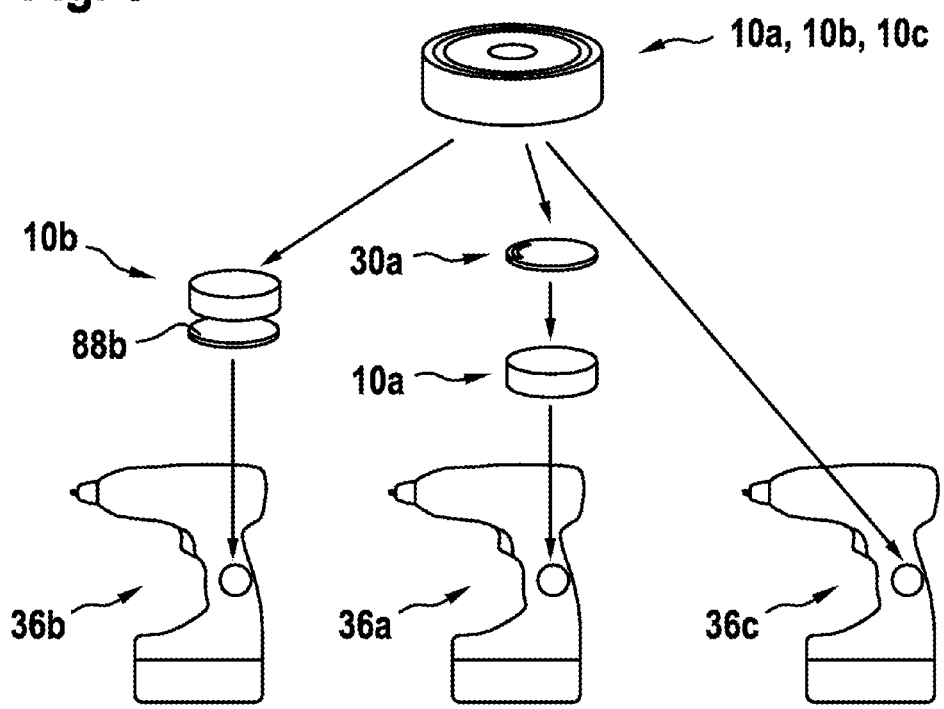

FIG. 4 shows an electronic module 10*b*, in particular for a hand-held machine tool. The electronic module 10*b* includes an electronic unit 12*b*. The electronic module 10*b* includes a contacting unit 14*b*. The contacting unit 14*b* comprises three contact elements 16*b*, 18*b*, 20*b*. The contact elements 16*b*, 18*b*, 20*b* have been provided for a transmission of electronic data. The electronic module 10*b* includes a cover unit 24*b*. The electronic unit 12*b* is connected to the cover unit 24*b* in captive manner. The contacting unit 14*b* includes a fixing element 26*b*. The fixing element 26*b* has been provided for mechanical fixing of the cover unit 24*b* to a tool 36*b* (FIG. 6). For this purpose, the electronic module 10*b* may also be sealed by a bottom element 88*b*, in particular an electronics-free bottom element 88*b*.

The contact elements 16*b*, 18*b*, 20*b* are partially arranged on the fixing element 26*b*. The cover unit 24*b* exhibits an at least substantially round outer contour. The cover unit 24*b* has been designed to be at least partially disk-shaped. The contact elements 16*b*, 18*b*, 20*b* have been provided for a radial contacting with a further electronic unit 28*b*. In this connection, however, it is also conceivable that the contact elements 16*b*, 18*b* have been provided for a radial contacting with a source of electrical energy. The radial direction extends perpendicular to an axial direction 62*b* which extends perpendicular to the disk-shaped cover unit 24*b*. The axial direction 62*b* extends through a geometrical midpoint of the cover unit 24*b*.

The fixing element 26*b* takes the form of a bayonet closure. The contacting unit 14*b* includes a further fixing element 86*b*. The further fixing element 86*b* exhibits the same structural configuration as the fixing element 26*b*. The fixing element 26*b* and the further fixing element 86*b* are arranged offset by 180° in relation to one another, observed in a peripheral direction. In other words, the fixing element 26*b* and the further fixing element 86*b* are arranged to be rotationally symmetrical to one another.

FIG. 5 shows an electronic module 10*c*, in particular for a hand-held machine tool. The electronic module 10*c* includes an electronic unit 12*c*. The electronic module 10*c* includes a contacting unit 14*c*. The contacting unit 14*c* comprises three contact elements 16*c*, 18*c*, 20*c*. The contact elements 16*c*, 18*c*, 20*c* have been provided for a transmission of electronic data. The electronic module 10*c* includes a cover unit 24*c*. The electronic unit 12*c* is connected to the cover unit 24*c* in captive manner. The contacting unit 14*c* includes a fixing element 26*c*. The fixing element 26*c* has been provided for mechanical fixing of the cover unit 24*c* to a tool 36*c* (FIG. 6).

The contacting unit 14*c* includes a plug-in connection element 40*c*. The contact elements 16*c*, 18*c*, 20*c* are arranged on the plug-in connection element 40*c*. The fixing element 26*c* has been integrally formed with the plug-in connection element 40*c*. The fixing element 26*c* has furthermore been integrally formed with a cover wall 42*c* of the cover unit 24*c*. The contact elements 16*c*, 18*c*, 20*c* are partially arranged on the fixing element 26*c*. More precisely, the contact elements 16*c*, 18*c*, 20*c* are partially enclosed by the fixing element 26*c*. The fixing element 26*c* has been provided for an insertion and/or latching in a bushing of complementary shape (not represented).

The invention claimed is:

1. An electronic module comprising:
   at least one cover unit;
   at least one electronic unit that is connected in a captive manner to the at least one cover unit and that includes a communication unit for at least one of wired data transmission with a tool, wireless data transmission with the tool, and data exchange with an external device;
   at least one contacting unit that includes:
      at least one contact element configured to one or more of contact a source of electrical energy and transmit electronic data, and
      at least one fixing element configured to mechanically fix the at least one cover unit to at least one of a tool and a housing unit of the electronic module, the at least one contact element at least partially arranged on the at least one fixing element; and at least one energy storage receiving area which is arranged adjacent to the at least one contacting unit, on a side of the at least one electronic unit facing away from the at least one cover unit, wherein the at least one contact element is arranged at least partially within a cover wall of the at least one cover unit, and the at least one cover unit has a closed surface on a side facing away from the at least one electronic unit, which extends over the at least one electronic unit and the at least one contacting unit.

2. The electronic module as claimed in claim 1, wherein the at least one contact element is configured for an axial contacting with one or more of the source of electrical energy and a further electronic unit.

3. The electronic module as claimed in claim 1, wherein the at least one contact element is configured for a radial contacting with one or more of the source of electrical energy and a further electronic unit.

4. The electronic module as claimed in claim 1, further comprising at least one expansion unit configured to couple with the at least one electronic unit and to provide a functional expansion of the at least one electronic unit.

5. The electronic module as claimed in claim 4, wherein the at least one expansion unit exhibits at least one bottom element configured at least to seal a receiving space in which the at least one electronic unit is arranged.

6. The electronic module as claimed in claim 4, wherein the at least one expansion unit includes at least one communication unit configured to wirelessly transmit data.

7. The electronic module as claimed in claim 1, wherein the at least one contacting unit includes at least one plug-in connection element on which the at least one contact element is arranged.

8. The electronic module as claimed in claim 1, wherein the at least one fixing element is configured as a bayonet closure.

9. The electronic module as claimed in claim 1, wherein the electronic unit is configured for a hand-held machine tool.

10. The electronic module as claimed in claim 1, wherein the at least one fixing element is configured to mechanically fix the cover unit to a tool.

11. A tool, comprising:
an electronic module including:
at least one cover unit,
at least one electronic unit connected in a captive manner to the at least one cover unit and that includes a communication unit for at least one of wired data transmission with a tool, wireless data transmission with the tool, and data exchange with an external device,
at least one contacting unit that includes:
at least one contact element configured to one or more of contact a source of electrical energy and transmit electronic data, and
at least one fixing element configured to mechanically fix the at least one cover unit to at least one of a tool and a housing unit of the electronic module, the at least one contact element at least partially arranged on the at least one fixing element, and
at least one energy storage receiving area which is arranged adjacent to the at least one contacting unit, on a side of the at least one electronic unit facing away from the at least one cover unit wherein
the at least one contact element is arranged at least partially within a cover wall of the at least one cover unit, and
the at least one cover unit has a closed surface on a side facing away from the at least one electronic unit, which extends over the at least one electronic unit and the at least one contacting unit.

12. The tool as claimed in claim 11, wherein the tool is configured as a hand-held machine tool.

13. An electronic module comprising:
at least one cover unit;
at least one electronic unit that is connected in a captive manner to the at least one cover unit;
at least one contacting unit that includes:
at least one contact element configured to one or more of contact a source of electrical energy and transmit electronic data, and
at least one fixing element configured to mechanically fix the at least one cover unit, the at least one contact element at least partially arranged on the at least one fixing element; and
at least one expansion unit configured to couple with the at least one electronic unit and to provide a functional expansion of the at least one electronic unit, wherein the at least one expansion unit exhibits at least one bottom element configured at least to seal a receiving space in which the at least one electronic unit is arranged.

* * * * *